US010519787B2

(12) United States Patent
Harris et al.

(10) Patent No.: US 10,519,787 B2
(45) Date of Patent: Dec. 31, 2019

(54) LOW RHENIUM SINGLE CRYSTAL SUPERALLOY FOR TURBINE BLADES AND VANE APPLICATIONS

(71) Applicant: Cannon-Muskegon Corporation, Muskegon, MI (US)

(72) Inventors: Kenneth Harris, Spring Lake, MI (US); Jacqueline B. Wahl, Norton Shores, MI (US)

(73) Assignee: Cannon-Muskegon Corporation, Muskegon, MI (US)

( * ) Notice: Subject to any disclaimer, the term of this patent is extended or adjusted under 35 U.S.C. 154(b) by 122 days.

(21) Appl. No.: 15/785,989

(22) Filed: Oct. 17, 2017

(65) Prior Publication Data

US 2018/0100401 A1    Apr. 12, 2018

Related U.S. Application Data

(63) Continuation of application No. 13/311,626, filed on Dec. 6, 2011, now abandoned.

(51) Int. Cl.
*C22C 19/05* (2006.01)
*F01D 5/28* (2006.01)
*C22F 1/10* (2006.01)
*C30B 29/52* (2006.01)

(52) U.S. Cl.
CPC .............. *F01D 5/288* (2013.01); *C22C 19/05* (2013.01); *C22C 19/057* (2013.01); *C22F 1/10* (2013.01); *C30B 29/52* (2013.01); *F01D 5/282* (2013.01); *F05D 2300/00* (2013.01); *F05D 2300/15* (2013.01); *F05D 2300/175* (2013.01); *F05D 2300/607* (2013.01)

(58) Field of Classification Search
CPC ................................. C22C 19/057; C22F 1/10
See application file for complete search history.

(56) References Cited

U.S. PATENT DOCUMENTS

| 4,719,080 A | 1/1988 | Duhl et al. |
| 5,346,563 A | 9/1994 | Allen et al. |
| 2003/0041930 A1 | 3/2003 | DeLuca et al. |

FOREIGN PATENT DOCUMENTS

EP    2415888 A2    2/2012

OTHER PUBLICATIONS

ASM International, Materials Park, Ohio Properties and Selection: Nonferrous Alloys and Special Purpose Materials: "Rare Earth Metals," Oct. 1990, vol. 2, pp. 720-732.
European Search Report, EPO form 1507N, dated Jan. 16, 2014.
Harris, Ken et al., "Improved Single Crystal Superalloys, CMSX-4 (SLS) [La+Y] and CMSX-486," Superalloys 2004, Article No. XP008108157, pp. 45-52, 2004.
Fink, Paul J. et al., "Rhenium Reduction—Alloy Design Using an Economically Strategic Element," Journal of Metals (JON), vol. 62 No. 1 pp. 55-57, Jan. 2010.
Cetel, A. D., et al., "Second-Generation Nickel-Base Single Crystal Superalloy," Superalloys 1988, The Metallurgical Society, 1988, pp. 235-244.
Pollock, Tresa M. et al., "Nickel-Based Superalloys for Advanced Turbine Engines: Chemistry, Microstructure, and Properties," Journal of Propulsion and Power, vol. 22, No. 2, Mar.-Apr. 2006, pp. 361-374.

*Primary Examiner* — Jessee R Roe
(74) *Attorney, Agent, or Firm* — Gunther J. Evanina; Butzel Long

(57) ABSTRACT

A low rhenium nickel-base superalloy for single crystal casting that exhibits excellent high temperature creep resistance, while also exhibiting other desirable properties for such alloys, comprises 5.60% to 5.80% aluminum by weight, 9.4% to 9.9% cobalt by weight, 4.9% to 5.5% chromium by weight, 0.08% to 0.35% hafnium by weight, 0.50% to 0.70% molybdenum by weight, 1.4% to 1.6% rhenium by weight, 8.1% to 8.5% tantalum by weight, 0.60% to 0.80 titanium by weight, 7.6 to 8.0% tungsten by weight the balance comprising nickel and minor amounts of incidental impurity elements.

15 Claims, 23 Drawing Sheets

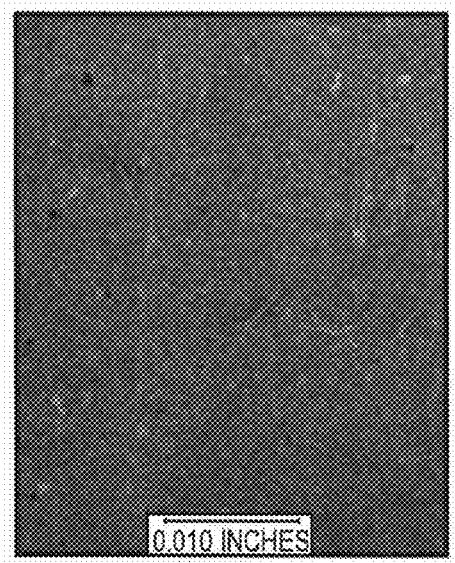 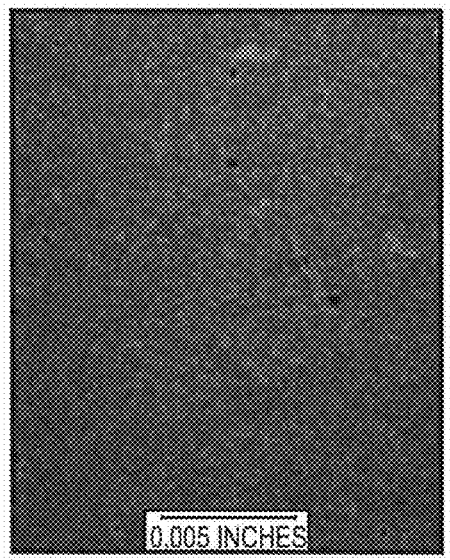
FIG. 22A  FIG. 22B
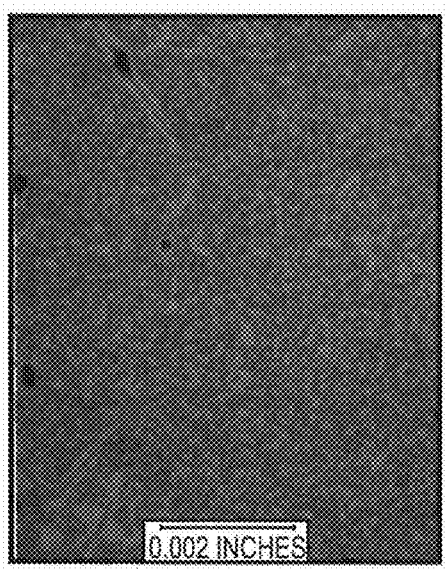
FIG. 22C

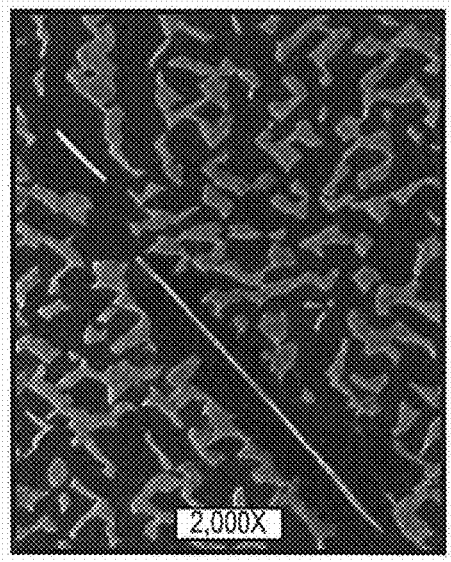
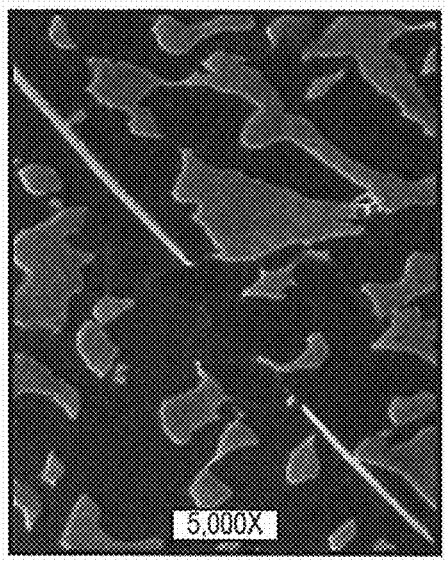
FIG. 23A  FIG. 23B
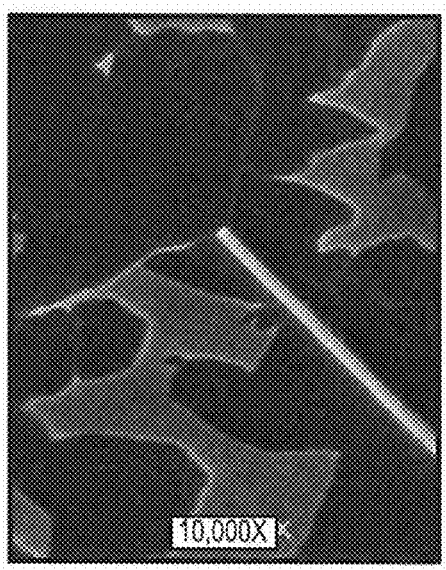
FIG. 23C

LOW RHENIUM SINGLE CRYSTAL SUPERALLOY FOR TURBINE BLADES AND VANE APPLICATIONS

CROSS-REFERENCE TO RELATED APPLICATIONS

This continuation application claims priority to U.S. patent application Ser. No. 13/311,626, now abandoned, filed on Dec. 6, 2011, and is hereby incorporated by reference in its entirety.

FIELD OF THE DISCLOSURE

Disclosed are single crystal nickel-base superalloys exhibiting excellent high temperature creep resistance, while having a reduced or low rhenium content, without deleteriously affecting other relevant characteristics for many turbine engine airfoil applications.

BACKGROUND OF THE DISCLOSURE

Because of a worldwide growing demand for products that have customarily required substantial quantities of relatively scarce metal elements, both the demand and prices of rare metal elements have sharply increased. As a result, manufacturers are searching for new technologies that will reduce or eliminate the need for these metal elements.

Rhenium is an example of a truly rare metal that is important to various industries. It is recovered in very small quantities as a by-product of copper-molybdenum and copper production. In addition to its high cost, use of rhenium presents a supply chain risk of both economic and strategic consequence.

Rhenium has been widely employed in the production of nickel-base superalloys used to cast single crystal gas turbine components for jet aircraft and power generation equipment. More specifically, rhenium is used as an additive in advanced single crystal superalloys for turbine blades, vanes and seal segments, because of its potent effect at slowing diffusion and thus slowing creep deformation, particularly at high temperatures (e.g., in excess of 1,000 degrees C.) for sustained periods of time. High temperature creep resistance is directly related to the useful service life of gas turbine components and turbine engine performance such as power output, fuel burn and carbon dioxide emissions.

Typical nickel-base superalloys used for single crystal castings contain from about 3% rhenium to about 7% rhenium by weight. Although rhenium has been used as only a relatively minor additive, it has been regarded as critical to single crystal nickel-base superalloys to inhibit diffusion and improve high temperature creep resistance, it adds considerably to the total cost of these alloys.

From the foregoing discussion, it should be apparent that it would be extremely desirable to develop single crystal nickel-base superalloys that exhibit excellent high temperature creep resistance, while significantly reducing the need for rhenium alloying additions, and while retaining other desirable properties such as creep-rupture, low cycle fatigue (LCF) strength and oxidation coating performance.

SUMMARY

The low rhenium single crystal nickel-base superalloys disclosed herein rely on, among other things, balancing the refractory metal elements (tantalum, tungsten, rhenium and molybdenum) at a total amount of from about 18% to 19% by weight in order to achieve good creep-rupture mechanical properties along with acceptable alloy phase stability, including freedom from excessive deleterious topological close-packed (TCP) phases that are rich in tungsten, rhenium and chromium, while substantially reducing the rhenium content.

It has been discovered that a low rhenium single crystal nickel-base superalloy exhibiting excellent high temperature creep resistance and other properties well suited for use in casting gas turbine components can be achieved in an alloy composition containing 5.60% to 5.80% aluminum by weight, 9.4% to 9.9% cobalt by weight, 4.9% to 5.5% chromium by weight, 0.08% to 0.35% hafnium by weight, 0.50% to 0.70% molybdenum by weight, 1.4% to 1.6% rhenium by weight, 8.1% to 8.5% tantalum by weight, 0.60% to 0.80% titanium by weight, 7.6% to 8.0% tungsten by weight, and the balance comprising nickel and minor amounts of incidental elements, the total amount of incidental elements being less than 1% by weight.

In the case of certain embodiments of the invention, the incidental elements of the nickel-base superalloy are present at maximum amounts of 100 ppm carbon, 0.04% silicon, 0.01% manganese, 3 ppm sulfur, 30 ppm phosphorous, 30 ppm boron, 0.10% niobium, 150 ppm zirconium, 0.01% copper, 0.15% iron, 0.10% vanadium, 0.10% ruthenium, 0.15% platinum, 0.15% palladium, 200 ppm magnesium, 5 ppm nitrogen (generally in the form of a metal nitride or carbonitride), 5 ppm oxygen (generally in the form of a stable metal oxide), and other trace elements present in amounts of about 25 ppm or less.

In accordance with certain embodiments, the trace elements of the incidental elements in the nickel-base superalloys are present at maximum amounts of 2 ppm silver, 0.2 ppm bismuth, 10 ppm gallium, 25 ppm calcium, 1 ppm lead, 0.5 ppm selenium, 0.2 ppm tellurium, 0.2 ppm thallium, 10 ppm tin, 2 ppm antimony, 2 ppm arsenic, 5 ppm zinc, 2 ppm mercury, 2 ppm cadmium, 2 ppm germanium, 2 ppm gold, 2 ppm indium, 20 ppm sodium, 10 ppm potassium, 20 ppm barium, 30 ppm phosphorous, 2 ppm uranium, and 2 ppm thorium.

In certain embodiments in which enhanced oxidation resistance and/or enhanced thermal barrier coating life are desired, sulfur is present at a maximum amount of 0.5 ppm, and lanthanum and yttrium are added to target an amount of total lanthanum and yttrium of from about 5 ppm to about 80 ppm in the single crystal components cast from the alloy.

In accordance with certain embodiments for large industrial gas turbine (IGT) single crystal applications in which a low angle boundary (LAB) strengthening of up to 12 degrees is desired, carbon is added in an amount from about 0.02% to about 0.05%, and boron is added in an amount of from about 40 ppm to about 100 ppm.

In accordance with certain embodiments, the alloy has a density that is about 8.90 gms/cc or less, such as about 8.85 gms/cc ($kg/dm^3$) at room temperature.

BRIEF DESCRIPTION OF THE DRAWINGS

FIGS. 22A, 22B and 22C are optical micrographs demonstrating that the post-test phase stability of single crystal test bar castings made using the disclosed alloys is surprisingly good, and that there are negligible detectable TCP phases (needles) (LA-11895, CMSX®-8, test bar #R926, 2000° F. (1093° C./83 MPa)/12 ksi/1979.9 hours, gage area).

FIGS. 23A, 23B and 23C are scanning electron micrographs demonstrating that the post-test phase stability of single crystal test bar castings made using the disclosed alloys is surprisingly good, and that there are negligible detectable TCP phases (needles) (LA-11895, CMSX®-8, test bar #R926, 2000° F. (1093° C./83 MPa)/12 ksi/1979.9 hours, gage area).

DETAILED DESCRIPTION

Figure 1A:
FIGS. 1A, 1B and 1C are optical micrographs of castings made from the disclosed alloys (LA-11825, CMSX®-8, test bar #N926, solutioned+2050° F./4 hours, gage area).

The low-rhenium nickel-base superalloys for single crystal casting disclosed herein will be designated "CMSX®-8" alloys, and will be referred to as such herein. The term "CMSX" is a trademark registered to Cannon-Muskegon Corporation for use in connection with the sale of a family of single crystal (SX) nickel-base superalloys.

Unless otherwise indicated herein, all amounts of elements are given as a percentage by weight or in parts per million (ppm) by weight based on the entire weight of the alloy composition.

Single crystal superalloys and castings have been developed to exhibit an array of outstanding properties including high temperature creep resistance, long fatigue life, oxidation and corrosion resistance, and solid solution strengthening, with desired casting properties with low rejection rates, and phase stability, among others. While it is possible to optimize a single additive for a particular property, the effects on other properties are often extremely unpredictable. Generally, the relationships among the various properties and various elemental components are extremely complex and unpredictable such that it is surprising when a substantial change can be made to the composition without deleteriously affecting at least certain essential properties.

With the embodiments disclosed herein, refractory metal elements (tantalum, tungsten, rhenium and molybdenum) (Table 1) were maintained at a total amount of from about 18% to about 19% by weight, while balancing the amounts of the refractory elements to achieve good creep-rupture mechanical properties along with acceptable alloy phase stability (freedom from excessive deleterious topological close-packed (TCP) phases—normally tungsten, rhenium and chromium rich in this type of alloy). Chromium and cobalt amounts are targeted accordingly to ensure this required phase stability. The high tantalum at approximately 8% is designed to give good single crystal castability and freedom from "freckling" defects, and, along with the 5.7% aluminum and the 0.7% titanium, appropriate γ' volume fraction at approximately 70% and low negative γ/γ' mismatch for high temperature creep strength, and acceptable room temperature density of about 8.85 gms/cc (kg/dm$^3$). The density of CMSX-4® is 8.70 gms/cc (kg/dm$^3$) and PWA 1484 is 8.95 gms/cc (kg/dm$^3$). Aluminum, tantalum and titanium are targeted at γ' volume fraction (Vf) attainment, along with low molybdenum for good high temperature oxidation properties. The small hafnium addition is required for coating life attainment at high temperatures.

Typical chemistry for the alloys disclosed and claimed herein are listed in Table 1. However, there are certain minor variations. First, in order to achieve enhanced oxidation resistance and/or enhanced thermal barrier coating life, it is desirable to add lanthanum and/or yttrium in amounts such that the total of lanthanum and yttrium is targeted to provide from about 5 to 80 ppm in the single crystal castings made from the alloys. As another variation, in the case of large industrial gas turbine (IGT) single crystal applications where low angle boundary (LAB) strengthening is provided up to 12 degrees, carbon and boron additions are targeted in the range from about 0.02% to 0.05% and 40-100 ppm, respectively.

TABLE 1

CHEMISTRY (WT %/ppm) SPECIFICATIONS
CMSX ®-8 ALLOY

Aero engine Applications

| C | 100 ppm | Ta | 8.1-8.5 |
|---|---|---|---|
| Si | .04% Max | Ti | .60-.80 |
| Mn | .01% Max | W | 7.6-8.0 |
| S | 3 ppm Max | Zr | 150 ppm Max |
| Al | 5.60-5.85 | Cu | .01% Max |
| B | 30 ppm Max | Fe | .15% Max |
| Cb (Nb) | .10% Max | V | .10% Max |
| Co | 9.4-9.9 | Ru | .10% Max |
| Cr | 4.9-5.5 | Pt | .15% Max |
| Hf | .08-.35 | Pd | .15% Max |
| Mo | .50-.70 | Mg | 200 ppm Max |
| Ni | Balance | [N] | 5 ppm Max |
| Re | 1.4-1.6 | [O] | 5 ppm Max |

TABLE 1-continued

CHEMISTRY (WT %/ppm) SPECIFICATIONS
CMSX ®-8 ALLOY

Enhanced oxidation resistance/coating and thermal barrier coating (TBC) life

| S | 0.5 ppm max |
| La + Y | 5-80 ppm (In the SX castings). |

Industrial Gas Turbine (IGT) SX Applications

| | Low angle boundary (LAB) Strengthened up to 12°. |
| C | 0.05% Max |
| B | 100 ppm Max |

TRACE ELEMENT CONTROLS - ALL APPLICATIONS

| Ag | 2 ppm Max | Hg | 2 ppm Max |
|---|---|---|---|
| Bi | .2 ppm Max | Cd | 2 ppm Max |
| Ga | 10 ppm Max | Ge | 2 ppm Max |
| Ca | 25 ppm Max | Au | 2 ppm Max |
| Pb | 1 ppm Max | In | 2 ppm Max |
| Se | .5 ppm Max | Na | 20 ppm Max |
| Te | .2 ppm Max | K | 10 ppm Max |
| Tl | .2 ppm Max | Ba | 10 ppm Max |
| Sn | 10 ppm Max | P | 30 ppm Max |
| Sb | 2 ppm Max | U | 2 ppm Max |
| As | 2 ppm Max | Th | 2 ppm Max |
| Zn | 5 ppm Max | | |

Density: 8.85 gms/cc (kg/dm$^3$).

The invention will be described below with respect to certain illustrative, non-limiting embodiments that will facilitate a better understanding.

A 470 lb 100% virgin initial heat of CMSX®-8 alloy was melted in May 2011 in the CM V-5 Consarc VIM furnace using aim chemistry to CM KH 04/20/11 (CM CRMP #81-1708 Issue 1). The heat (5V0460) chemistry is shown in Table 2.

Two molds (#s 925 and 926) of SX NNS DL-10 test bars were cast to CMSX-4® casting parameters by Rolls-Royce Corporation (SCFO). DL-10 test bar yield at 23 fully acceptable out of a total 24 cast was excellent.

These DL-10 test bars were solutioned/homogenized and double aged heat treated at Cannon-Muskegon Corporation as follows—based on prior work with a precursor similar family alloy designated CMSX®-7.

Figure 1B:
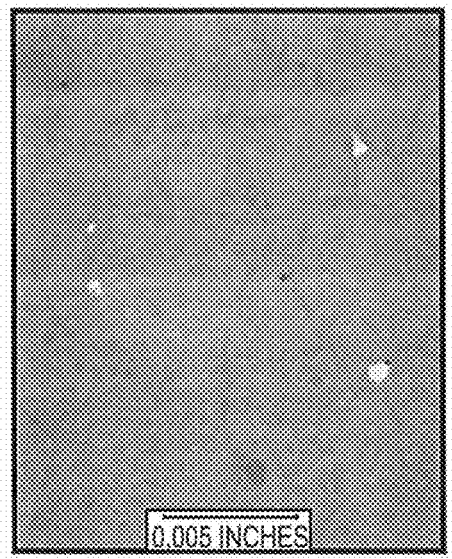
Figure 1C:
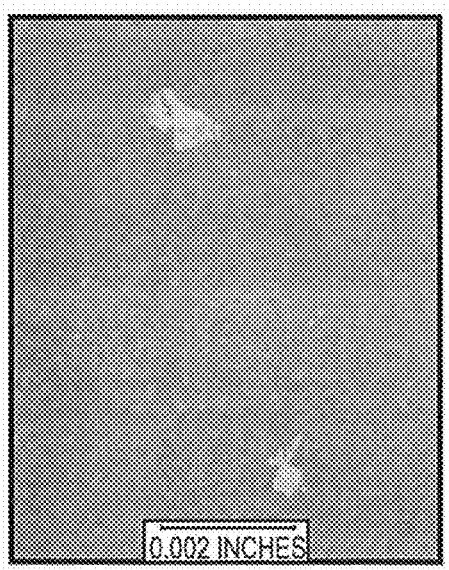
Figure 2A:
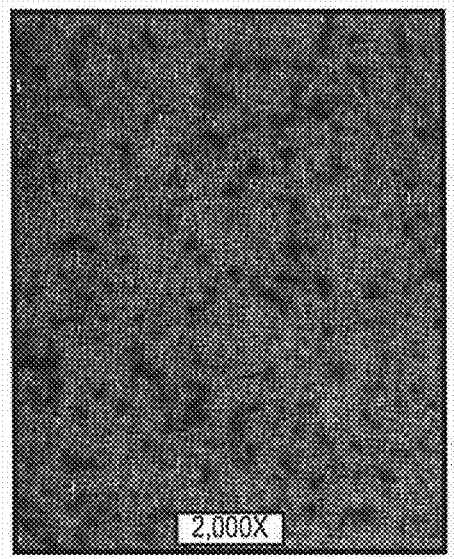
FIGS. 2A, 2B and 2C are scanning electron micrographs of castings made using the disclosed alloys (LA-11825, CMSX®-8, test bar #N926, solutioned+2050° F./4 hours, gage area).
Figure 2B:
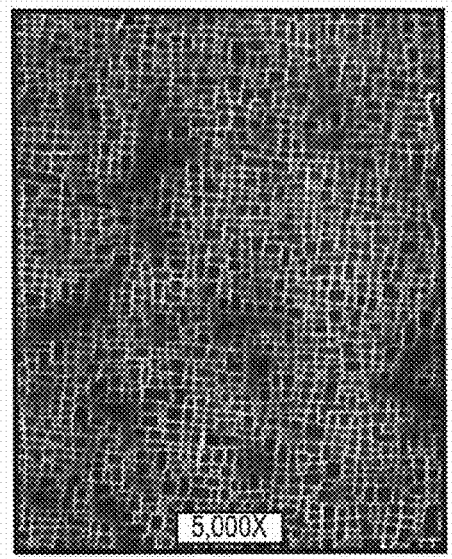
Figure 2C:
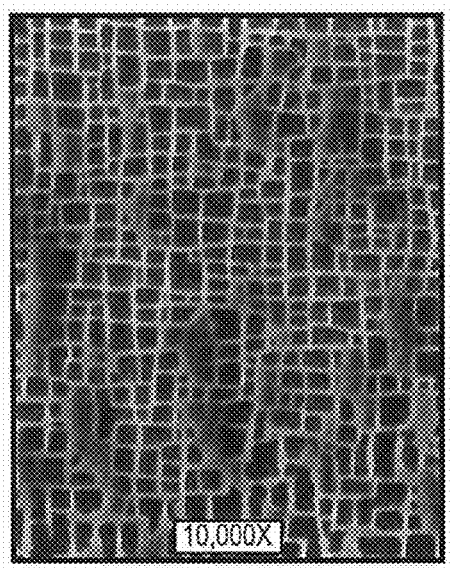

Solutioning and Homogenization
2 hrs/2340° F. (1282° C.)+2 hrs/2360° F. (1293° C.)
+4 hrs/2380° F. (1304° C.)+4 hrs/2390° F. (1310° C.)
+12 hrs/2400° F. (1316° C.) AC (air cool)—ramping up at 1° F./min. between steps
+
Double Aged Heat Treatment
4 hrs/2050° F. (1121° C.) AC+20 hrs/1600° F. (871° C.) AC Good microstructure attainment is evident in FIGS. 1-2—complete γ' solutioning, little remnant γ/γ' eutectic, no incipient melting and approximately 0.45 μm average cubic, aligned γ', indicating appropriate γ/γ' mismatch and γ/γ' inter-facial chemistry, following the 4 hr/2050° F. (1121° C.) high temperature age.

Figure 3:
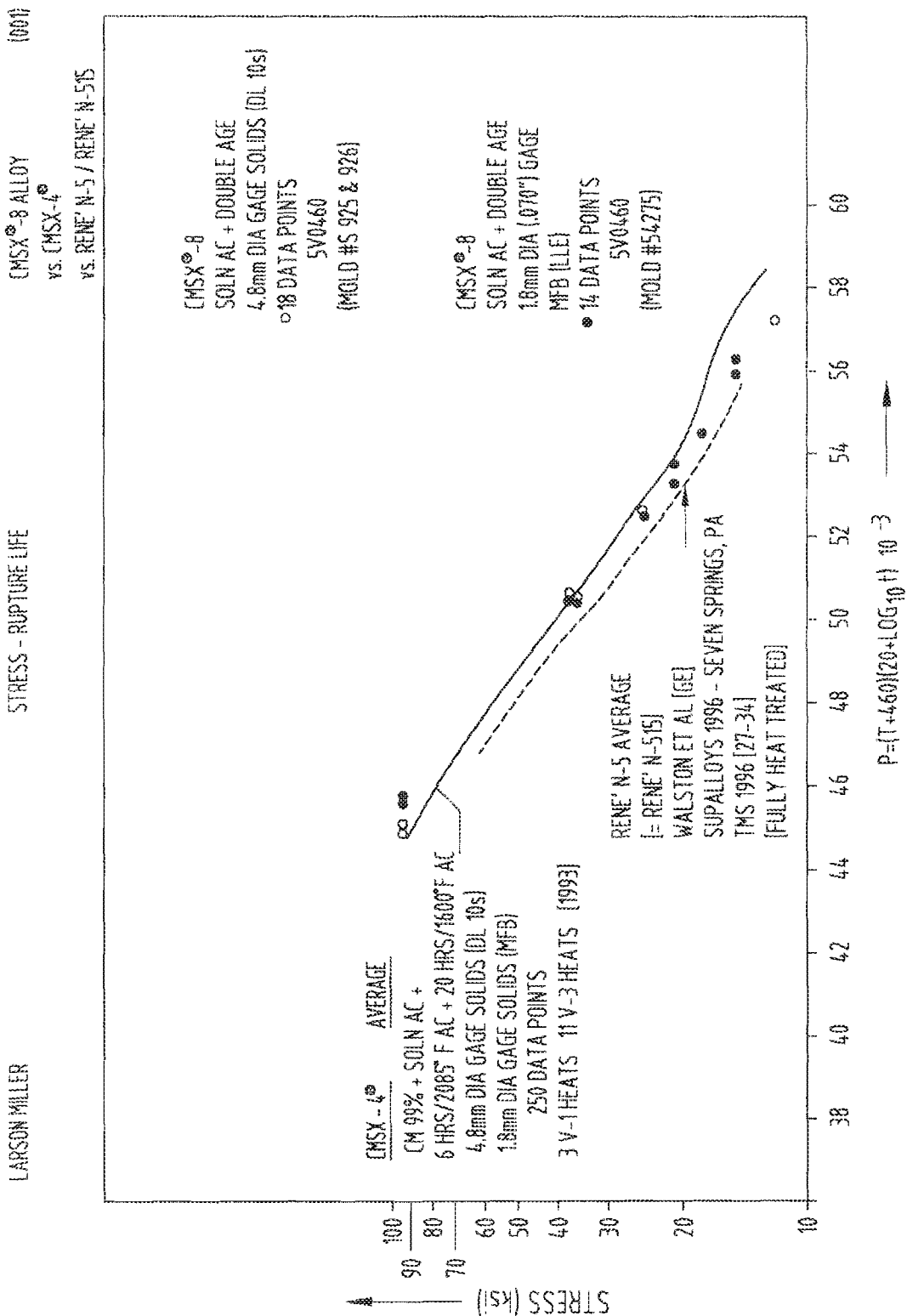
FIGS. 3 and 4 are Larson-Miller stress-rupture and stress-1.0% creep diagrams showing that the alloys disclosed herein have properties similar to advanced CMSX-4® single crystal nickel-base superalloy having a substantially higher rhenium content, up to 1900° F. (1040° C.).
Figure 4:
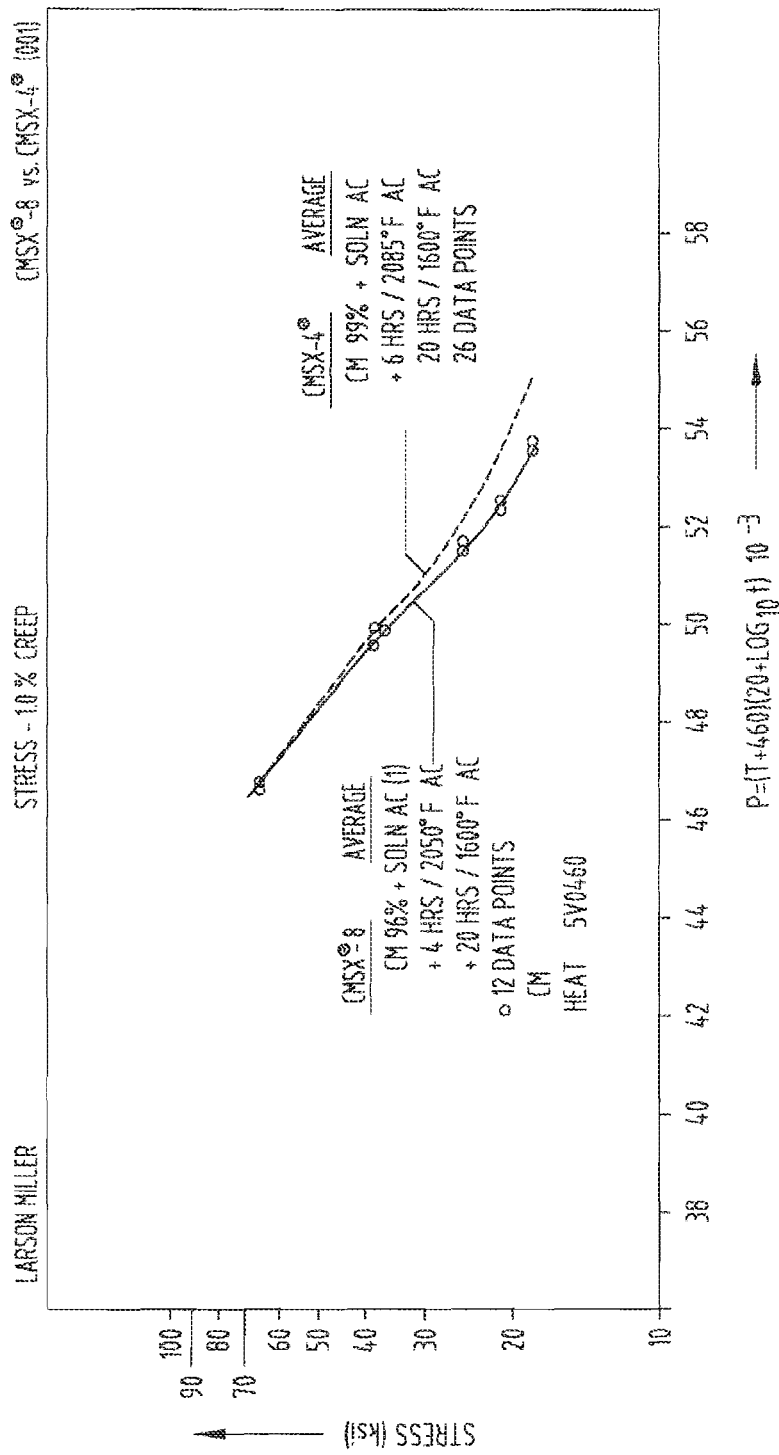
Figure 5A:
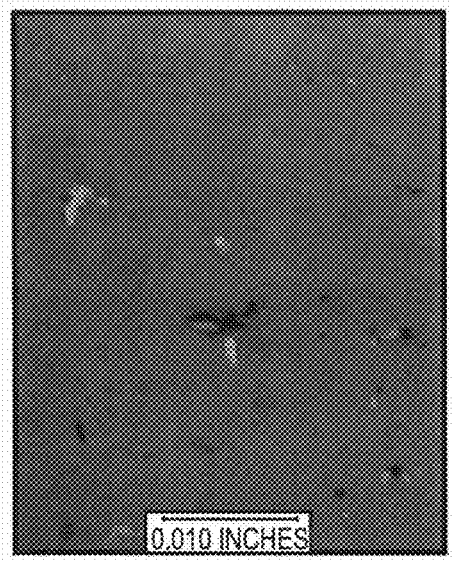
FIGS. 5A, 5B and 5C are optical micrographs demonstrating that the post-test phase stability of single crystal test bar castings made using the disclosed alloys is surprisingly good, and that there are no detectable TCP phases (LA-11848, CMSX®-8, test bar #A925, 1562° F./94.4 ksi/211.9 hours, fracture area).
Figure 5B:
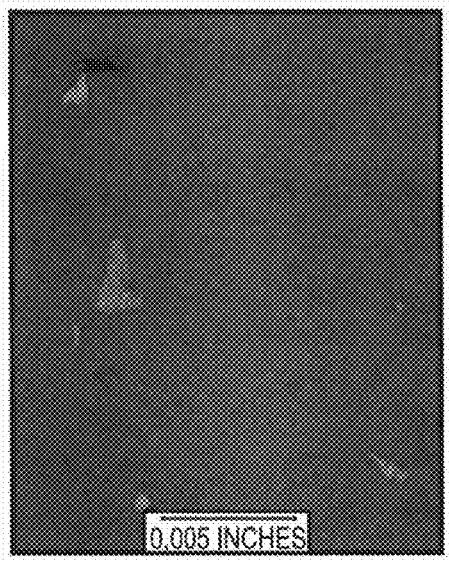
Figure 5C:
Figure 6A:
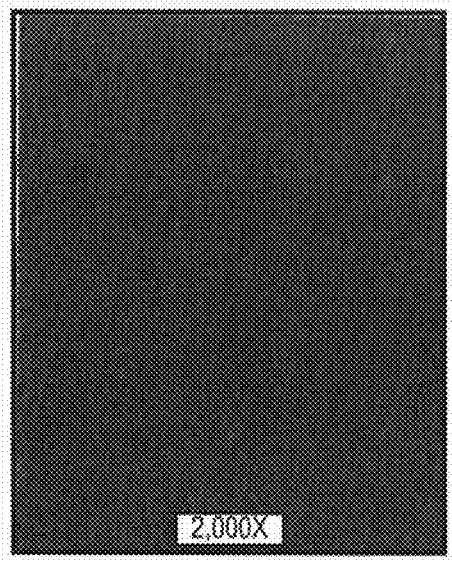
FIGS. 6A, 6B and 6C are scanning electron micrographs demonstrating that the post-test phase stability of single crystal test bar castings made using the disclosed alloys is surprisingly good, and that there are no detectable TCP phases (LA-11848, CMSX®-8, test bar #A925, 1562° F./94.4 ksi/211.9 hours, fracture area).
Figure 6B:
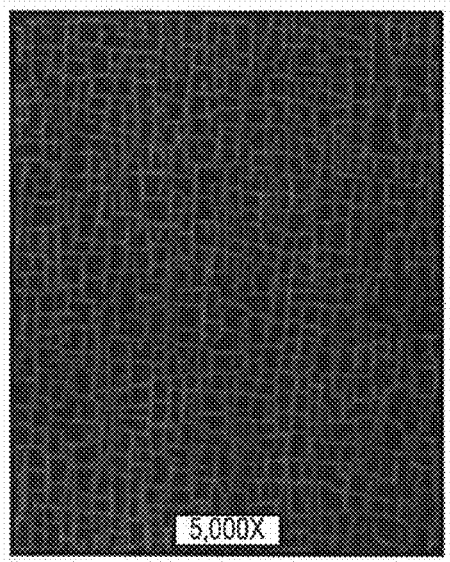
Figure 6C:
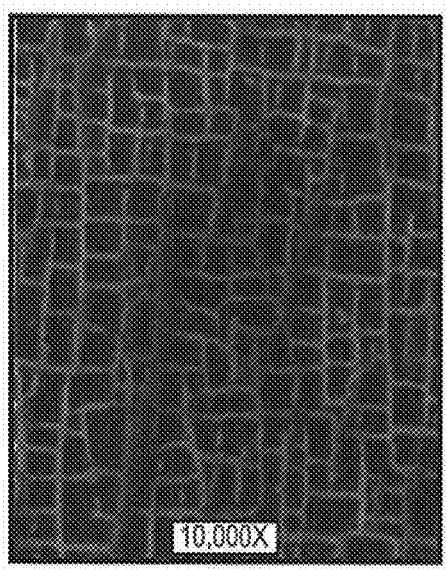
Figure 7A:
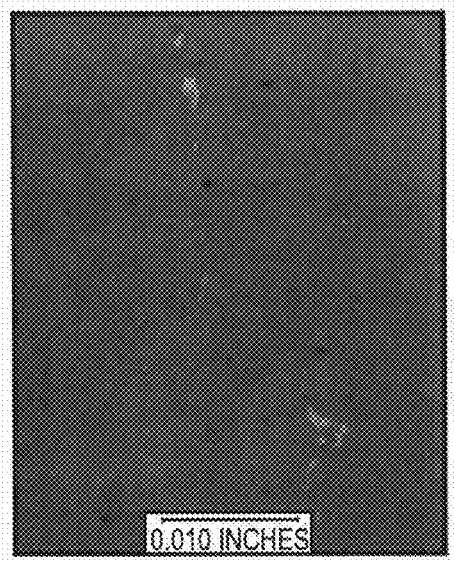
FIGS. 7A, 7B and 7C are optical micrographs demonstrating that the post-test phase stability of single crystal test bar castings made using the disclosed alloys is surprisingly good, and that there are no detectable TCP phases (LA-11848, CMSX®-8, test bar #A925, 1562° F./94.4 ksi/211.9 hours, gage area).
Figure 7B:
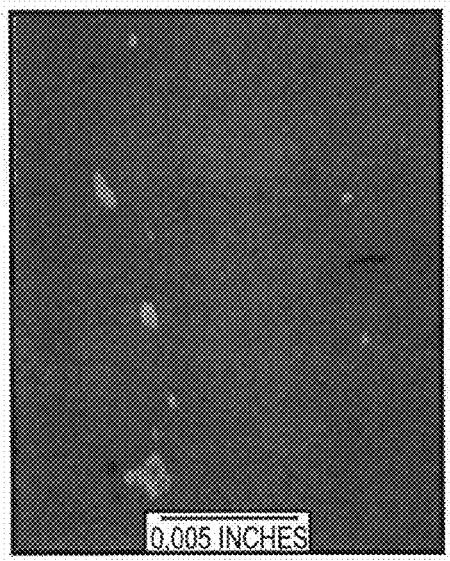
Figure 7C:
Figure 8A:
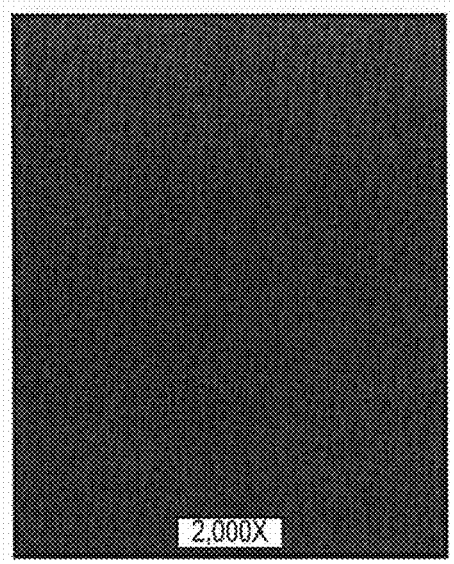
FIGS. 8A, 8B and 8C are scanning electron micrographs demonstrating that the post-test phase stability of single crystal test bar castings made using the disclosed alloys is surprisingly good, and that there are no detectable TCP phases (LA-11848, CMSX®-8, test bar #A925, 1562° F./94.4 ksi/211.9 hours, gage area).
Figure 8B:
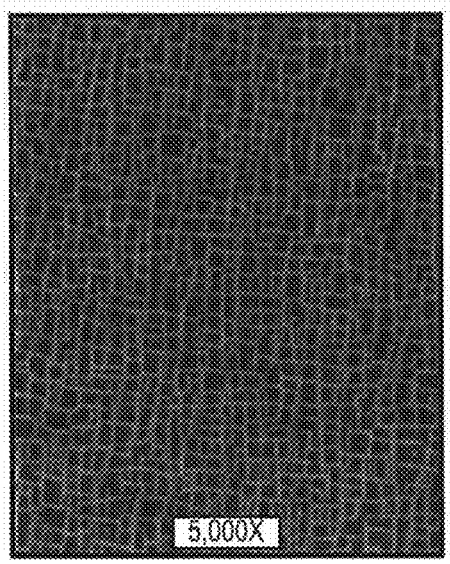
Figure 8C:
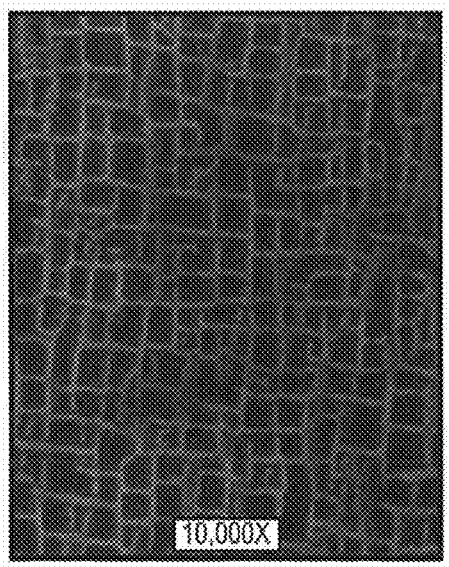
Figure 9A:
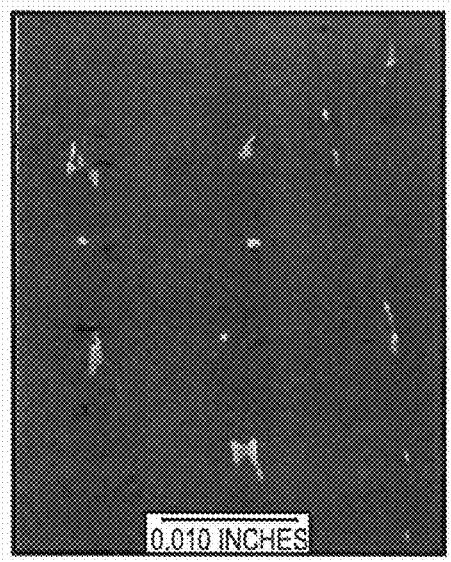
FIGS. 9A, 9B and 9C are optical micrographs demonstrating that the post-test phase stability of single crystal test bar castings made using the disclosed alloys is surprisingly good, and that there are no detectable TCP phases (LA-11848, CMSX®-8, test bar #E926, 1800° F./36 ksi/246.7 hours, fracture area).
Figure 9B:
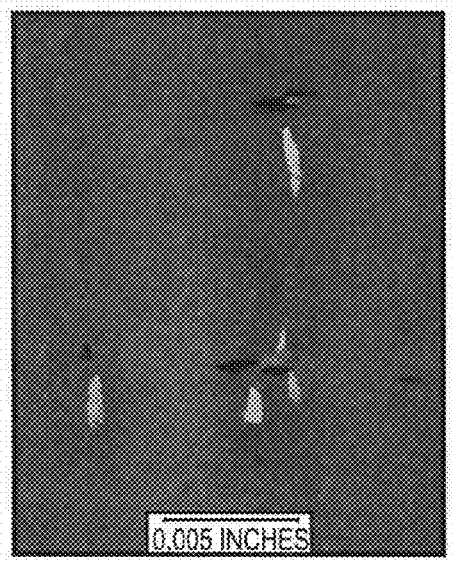
Figure 9C:
Figure 10A:
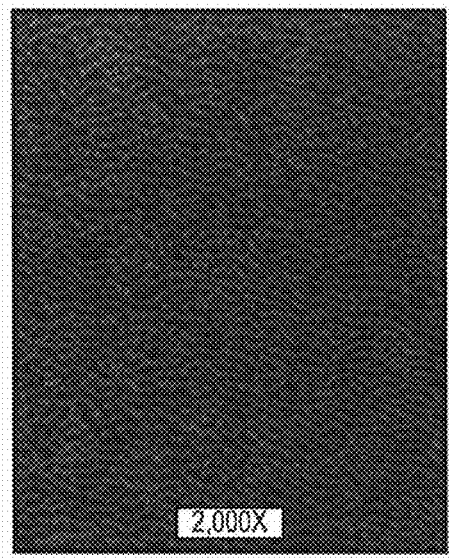
FIGS. 10A, 10B and 10C are scanning electron micrographs demonstrating that the post-test phase stability of single crystal test bar castings made using the disclosed alloys is surprisingly good, and that there are no detectable TCP phases (LA-11848, CMSX®-8, test bar #E926, 1800° F./36 ksi/246.7 hours, fracture area).
Figure 10B:
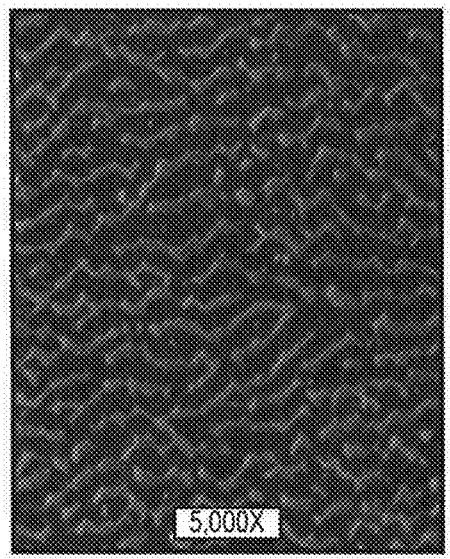
Figure 10C:
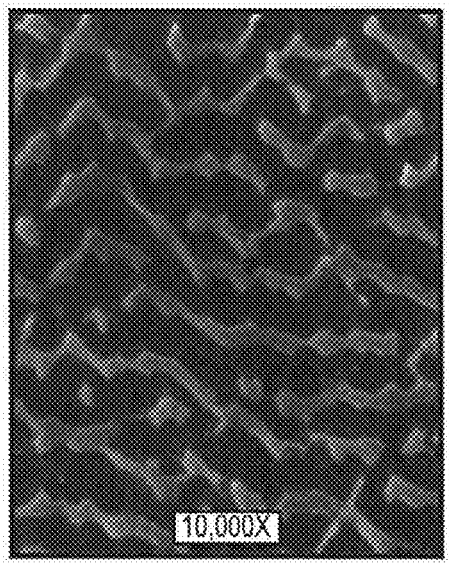
Figure 11A:
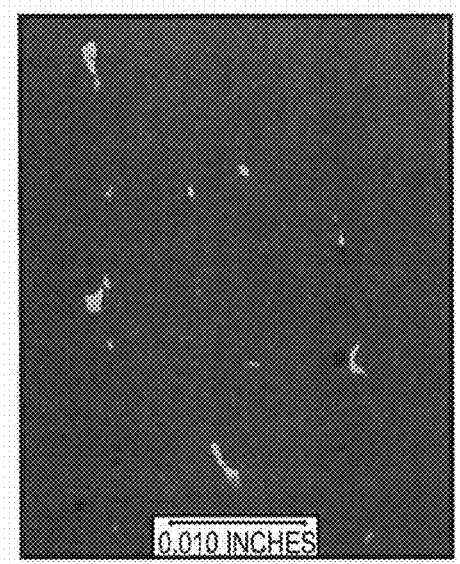
FIGS. 11A, 11B and 11C are optical micrographs demonstrating that the post-test phase stability of single crystal test bar castings made using the disclosed alloys is surprisingly good, and that there are no detectable TCP phases (LA-11848, CMSX®-8, test bar #E926, 1800° F./36 ksi/ 246.7 hours, gage area).
Figure 11B:
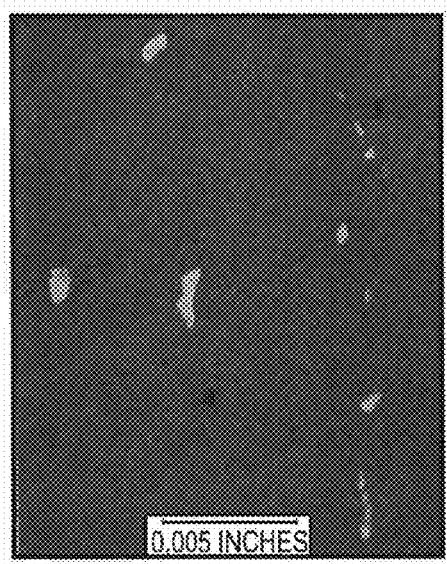
Figure 11C:
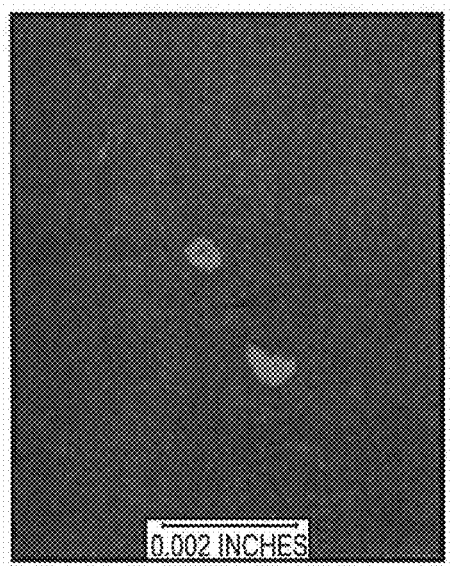
Figure 12A:
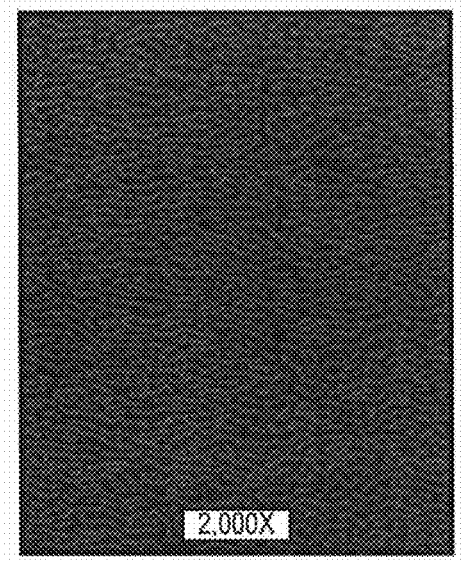
FIGS. 12A, 12B and 12C are scanning electron micrographs demonstrating that the post-test phase stability of single crystal test bar castings made using the disclosed alloys is surprisingly good, and that there are no detectable TCP phases (LA-11848, CMSX®-8, test bar #E926, 1800° F./36 ksi/246.7 hours, gage area).
Figure 12B:
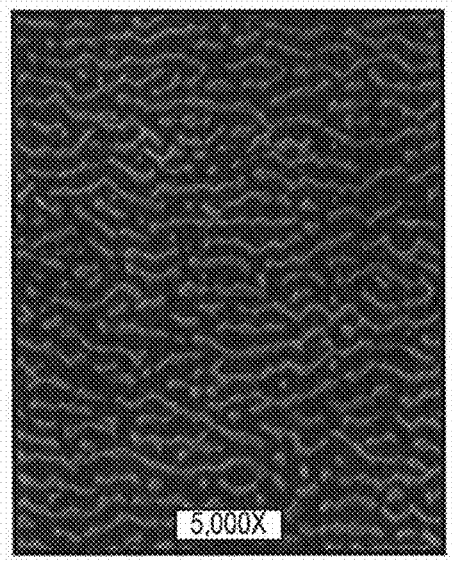
Figure 12C:
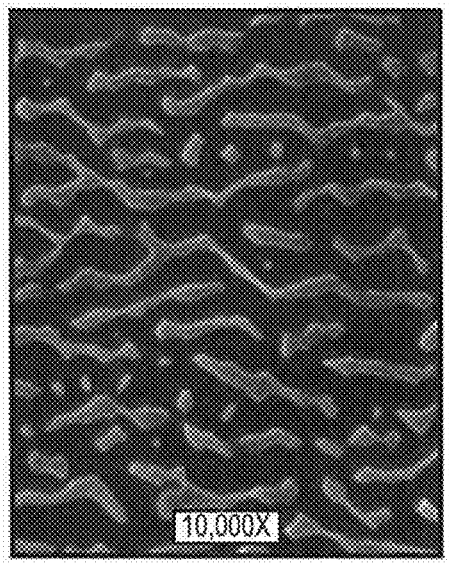
Figure 13A:
FIGS. 13A, 13B and 13C are optical micrographs demonstrating that the post-test phase stability of single crystal test bar castings made using the disclosed alloys is surprisingly good, and that there are no detectable TCP phases (LA-11848, CMSX®-8, test bar #L926, 2050° F./15 ksi/ 285.4 hours, fracture area).
Figure 13B:
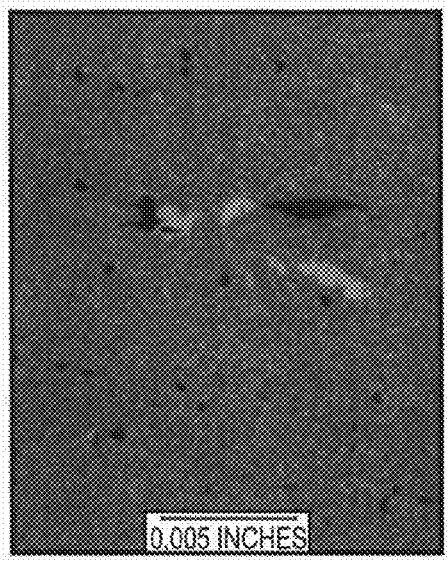
Figure 13C:
Figure 14A:
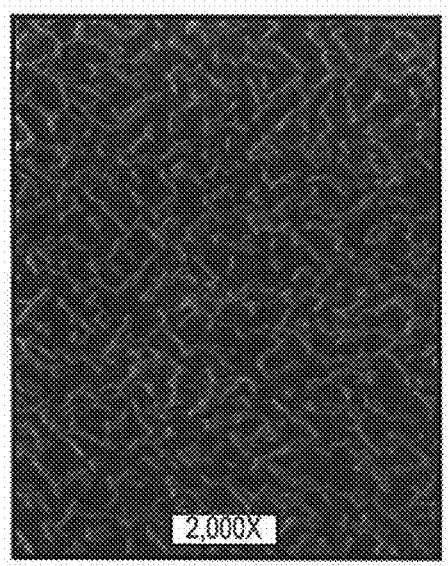
FIGS. 14A, 14B and 14C are scanning electron micrographs demonstrating that the post-test phase stability of single crystal test bar castings made using the disclosed alloys is surprisingly good, and that there are no detectable TCP phases (LA-11848, CMSX®-8, test bar #L926, 2050° F./15 ksi/285.4 hours, fracture area).
Figure 14B:
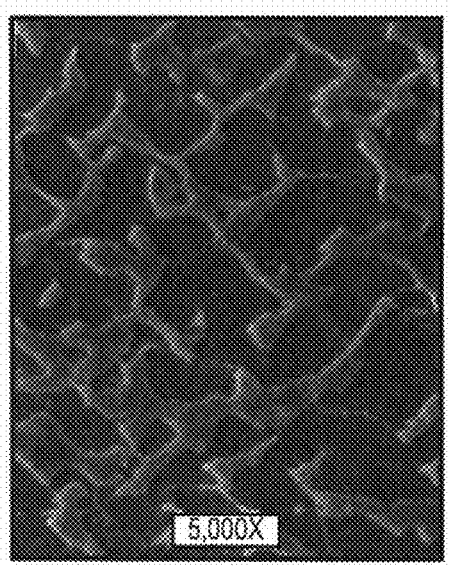
Figure 14C:
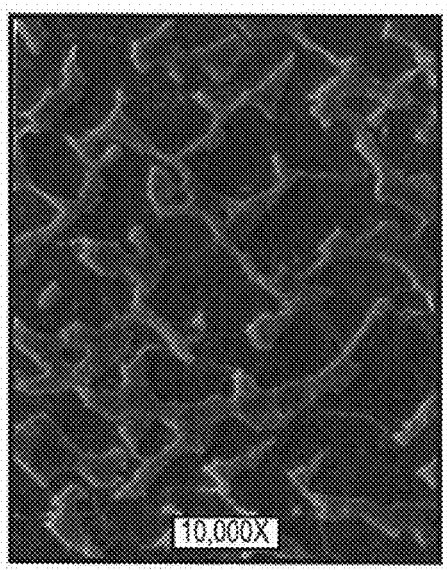
Figure 15A:
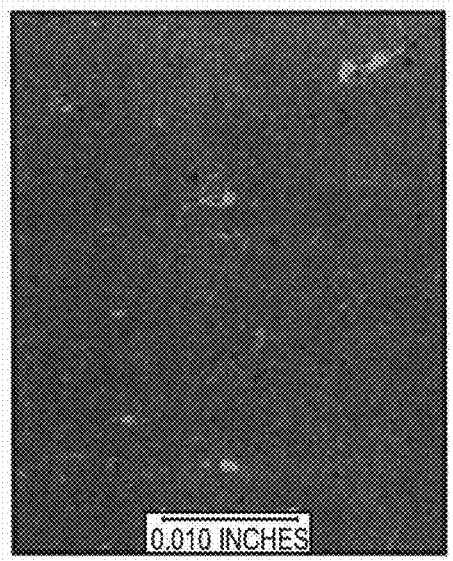
FIGS. 15A, 15B and 15C are optical micrographs demonstrating that the post-test phase stability of single crystal test bar castings made using the disclosed alloys is surprisingly good, and that there are no detectable TCP phases (LA-11848, CMSX®-8, test bar #L926, 2050° F./15 ksi/ 285.4 hours, gage area).
Figure 15B:
Figure 15C:
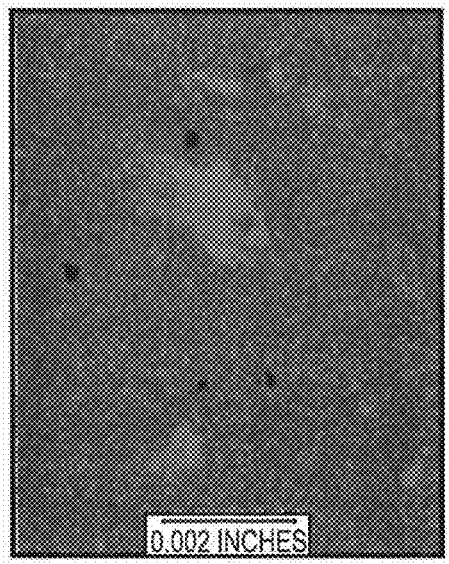
Figure 16A:
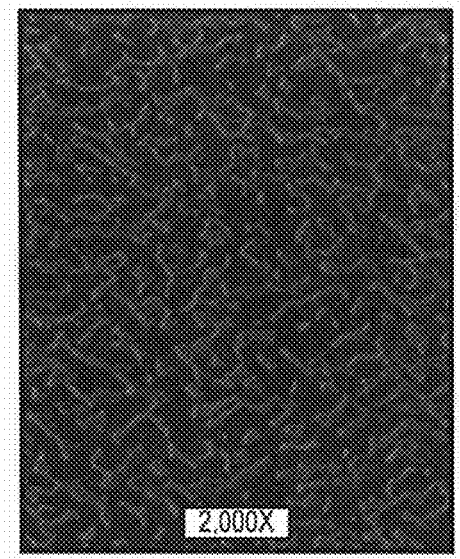
FIGS. 16A, 16B and 16C are scanning electron micrographs demonstrating that the post-test phase stability of single crystal test bar castings made using the disclosed alloys is surprisingly good, and that there are no detectable TCP phases (LA-11848, CMSX®-8, test bar #L926, 2050° F./15 ksi/285.4 hours, gage area).
Figure 16B:
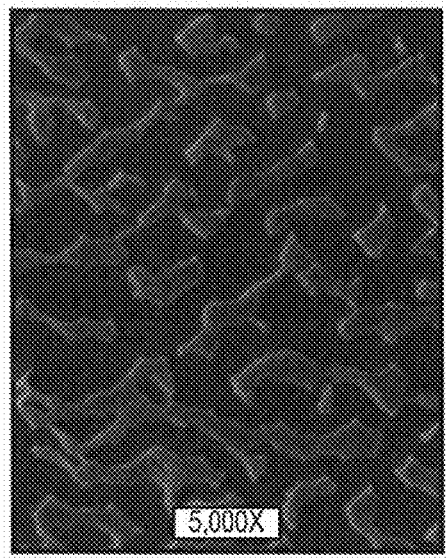
Figure 16C:
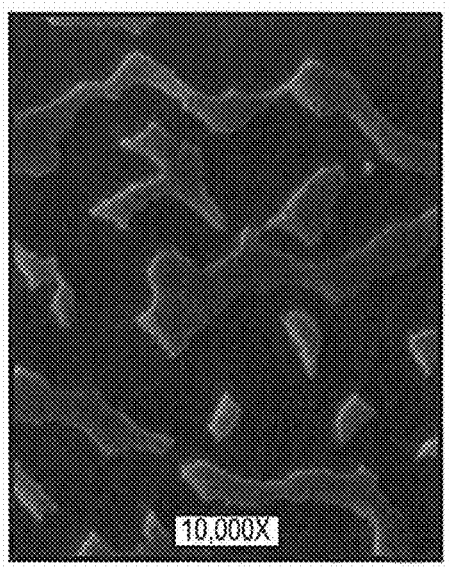

Creep—and stress-rupture specimens were low stress ground and tested by Joliet Metallurgical Labs, with the results to date shown in Table 3. Larson-Miller stress-rupture and stress—1.0% creep (FIGS. 3 & 4) show CMSX®-8 has similar and surprisingly good creep strength/stress-rupture life properties to CMSX-4® alloy (3% Re) up to approximate 1850° F.-1900° F. (1010-1038° C.), with fall-off at 2050° F. (1121° C.) due to its cost saving lower Re (1.5%) content. All these properties are significantly higher than Rene' N-5 (3% Re) and Rene' N-515 (low Re) alloys (JOM, Volume 62, Issue 1, pp. 55-57).

TABLE 2

HEAT #5V0460 CMSX ®-8 - 100% VIRGIN CHEMISTRY (WT ppm/%)

| | |
|---|---|
| C | 9 ppm |
| Si | <.02 |
| Mn | <.001 |
| S | 1 ppm |
| Al | 5.72 |
| B | <20 ppm |
| Cb (Nb) | <.05 |
| Co | 9.7 |
| Cr | 5.4 |
| Hf | .30 |
| Mo | .59 |
| Ni | Balance |
| Re | 1.5 |
| Ta | 8.3 |
| Ti | .71 |
| W | 7.8 |
| Zr | <10 ppm |
| Cu | <.001 |
| Fe | .010 |
| V | <.005 |
| Ru | <.01 |
| Pt | <.001 |
| Pd | <.001 |
| Mg | <100 ppm |
| [N] | 2 ppm |
| [O] | 2 ppm |
| Y | <.001 |
| La | <.001 |
| Ce | <.002 |
| Ag | <.4 ppm |
| Bi | <.2 ppm |
| Ga | <10 ppm |
| Ca | <25 ppm |
| Pb | <.5 ppm |
| Se | <.5 ppm |
| Te | <.2 ppm |
| Tl | <.2 ppm |
| Sn | <2 ppm |
| Sb | <1 ppm |
| As | <1 ppm |
| Zn | <1 ppm |
| Hg | <2 ppm |
| Cd | <.2 ppm |
| Ge | <1 ppm |
| Au | <.5 ppm |
| In | <.2 ppm |
| Na | <10 ppm |
| K | <5 ppm |
| Ba | <10 ppm |
| P | 6 ppm |
| U | <.5 ppm |
| Th | <1 ppm |

TABLE 3

CMSX ®-8 Heat - 5V0460
Molds 925/926 - RR SCFO [Indy] - LA 11832 (Joliet/CM 366)
Fully Heat Treated - Solution + Double Age [DL-10 s]

Creep-Rupture

| Test Condition | ID | Rupture Life, hrs | % Elong | % RA | 1% Creep | 2% Creep |
|---|---|---|---|---|---|---|
| 1562° F./94.4 ksi | A925 | 211.9 | 17.5 | 21.5 | 7.3 | 39.1 |
| [850° C./651 Mpa] | B926 | 157.1 | 16.4 | 22.8 | 2.3 | 23.2 |
| 1600° F./65.0 ksi | B925 | 1072.0 | 27.4 | 33.5 | 482.8 | 631.5 |
| [871° C./448 Mpa] | C926 | 983.5 | 26.8 | 33.0 | 407.8 | 536.4 |
| 1800° F./36.0 ksi | C925 | 200.2 | 35.0 | 43.3 | 109.7 | 125.1 |
| [982° C./248 Mpa] | E926 | 246.7 | 44.6 | 46.0 | 120.0 | 140.1 |
| 1850° F./38.0 ksi | E925 | 86.0 | 37.2 | 38.6 | 39.7 | 46.6 |
| [1010° C./262 Mpa] | H926 | 65.9 | 41.4 | 44.4 | 28.6 | 35.6 |
| 1900' F./25.0 ksi | H925 | 214.7 | 38.6 | 39.4 | 82.0 | 105.0 |
| [1038° C./172 Mpa] | J926 | 199.6 | 33.2 | 39.5 | 65.3 | 93.7 |
| 1904° F./21.0 ksi | J925 | 362.4 | 30.0 | 37.5 | 141.3 | 182.6 |
| [1040° C./145 Mpa] | K926 | 359.1 | 33.1 | 34.8 | 164.2 | 194.6 |
| 1950° F./18.0 ksi | L925 | 481.1 | 31.4 | 34.9 | 194.1 | 246.1 |
| [1066° C./124 Mpa] | M926 | 449.6 | 40.0 | 38.9 | 166.1 | 211.5 |

Stress-Rupture

| Test Condition | ID | Rupture Life, hrs | (4 D) % Elong | % RA |
|---|---|---|---|---|
| 2000° F./12.0 ksi | N925 | 1983.2 | 13.0 | 37.9 |
| [1093°/83 Mpa] | R926 | 1979.9 | 24.8 | 33.0 |
| 2050° F./15.0 ksi | R925 | 275.5 | 24.5 | 38.3 |
| [1121°/103 Mpa] | L926 | 285.4 | 22.9 | 40.4 |

Alternate Heat Treatment (Tmax 2408° F.)

| | | | | | | |
|---|---|---|---|---|---|---|
| 1800° F./36.0 ksi | D925 | 249.0 | 43.1 | 44.0 | 114.5 | 134.8 |
| [982° C./248 Mpa] | | | | | | |
| 2050° F./15.0 ksi | A926 | 271.8 | 13.6 | 38.1 | — | — |
| [1121°/103 Mpa] | | | | | | |

Phase stability is surprisingly good with absolutely negligible TCP phases apparent in the post-test creep/stress rupture bars examined to date (FIGS. 5-16 inclusive and 22-23 inclusive).

Figure 17A:
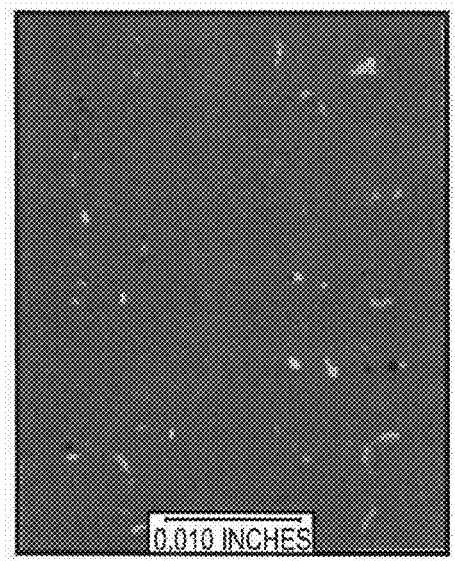
FIGS. 17A, 17B and 17C are optical micrographs showing adequate solutioning and/or homogenizing of an alloy casting using a shortened heat treatment cycle (LA-11862, CMSX®-8, test bar #A926, solutioned to 2408° F./8 hours, longitudinal).
Figure 17B:
Figure 17C:
Figure 19A:
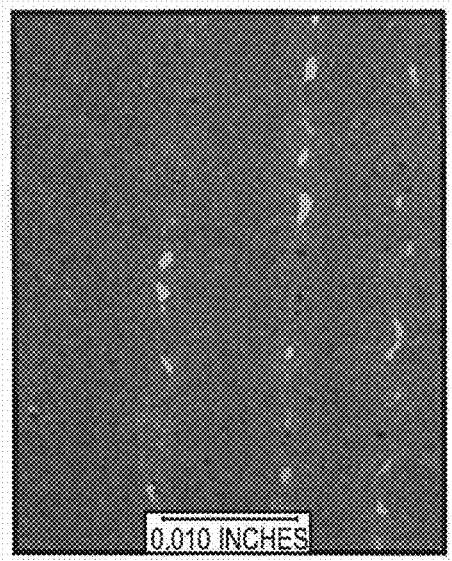
FIGS. 19A, 19B and 19C are optical micrographs demonstrating that the post-test phase stability of single crystal test bar castings made using the disclosed alloys is surprisingly good, and that there are no detectable TCP phases (LA-11890, CMSX®-8, test bar #A926, 2050° F./15 ksi (1121° C./103 MPa)/271.8 hours, gage area).
Figure 19B:
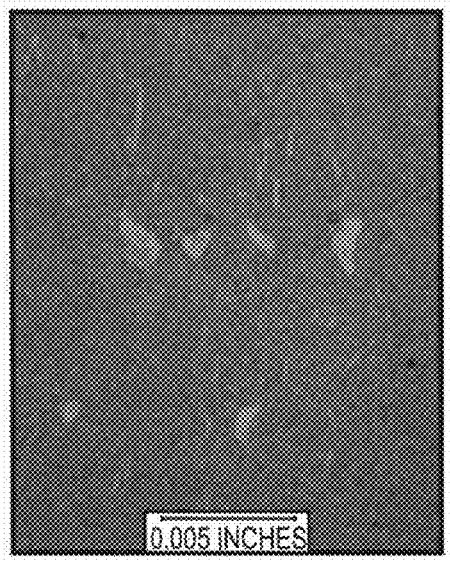
Figure 19C:
Figure 20A:
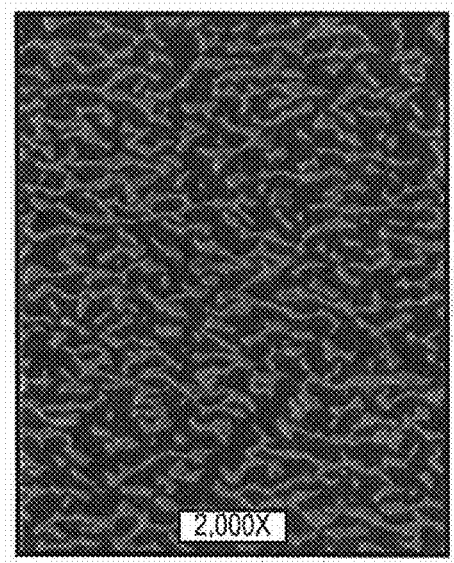
FIGS. 20A, 20B and 20C are scanning electron micrographs demonstrating that the post-test phase stability of single crystal test bar castings made using the disclosed alloys is surprisingly good, and that there are no detectable TCP phases (LA-11890, CMSX®-8, test bar #A926, 2050° F./15 ksi (1121° C./103 MPa)/271.8 hours, gage area).
Figure 20B:
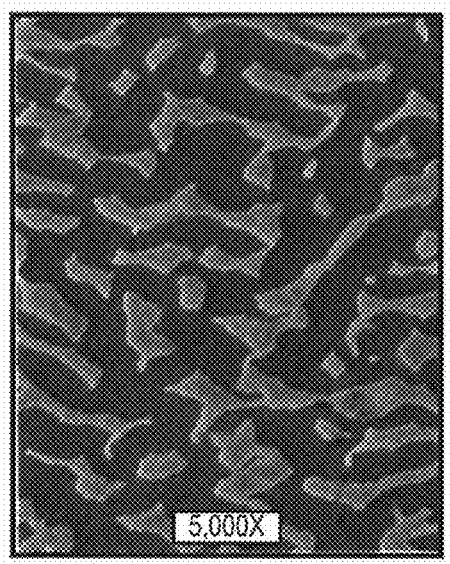
Figure 20C:
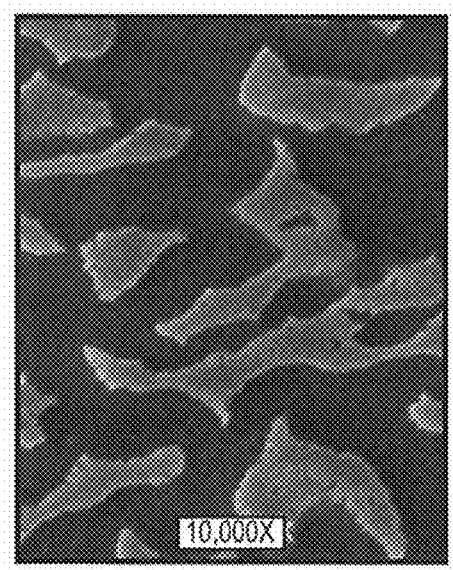

Recent work has shown it is possible to adequately solution/homogenize heat treat a single crystal test bar in the alloy (FIG. 17), using a shortened cycle—2 hrs/2365° F. (1296° C.)+2 hrs/2385° F. (1307° C.)+2 hrs/2395° F. (1313° C.)+2 hrs/2403° F. (1317° C.)+8 hrs/2408° F. (1320° C.) AC (8 hrs shorter). Limited creep/stress-rupture properties at critical conditions using this shorter solution/homogenization heat treatment show very similar results to the original solution heat treatment condition (Table 3 and 4) and good phase stability [no TCP phases] (FIGS. 19 & 20).

Burner rig dynamic, cyclic oxidation and hot corrosion (sulfidation) testing is currently scheduled at a major turbine engine company.

Creep/stress-rupture data for fully heat treated solution/homogenized and double aged (DL-10s) test specimens for the disclosed alloys are presented in Table 4.

TABLE 4

CMSX ®-8 Heat 5V0460
Heat 5V0460 - Mold 54275 - HP2 Solid Turbine Blades
RR SCFO [Indy] - LA11865 (Joliet 9220/CM-373)
Fully Heat Treated - Solution + double age - 2050° F. Primary age Stress-Rupture MFB Mini Bars [0.070 "ø gage] (LLE)

| Test Condition | ID | Rupture Life, hrs | % (4 D) Elong | % RA |
|---|---|---|---|---|
| 1562° F./94.4 ksi | 54275A-B | 449.0 | 16.3 | 18.7 |
| [850° C./651 MPa] | 54275B-B | 359.8 | 18.7 | 19.9 |
| 1800° F./36.0 ksi | 54275E-B | 223.4 | 43.1 | 45.6 |
| [982° C./248 MPa] | 54275H-B | 219.1 | 45.1 | 46.9 |
| 1850° F./38.0 ksi | 54275I-B | 74.2 | 46.2 | 47.8 |
| [1010° C./262 MPa] | 54275J-B | 76.7 | 39.2 | 43.8 |
| 1900° F./25.0 ksi | 54275K-B | 181.8 | 41.2 | 48.5 |
| [1038° C./172 MPa] | 54275L-B | 190.8 | 41.8 | 38.9 |
| 1904° F./21.0 ksi | 54275R-B | 354.0 | 43.9 | 40.2 |
| [1040° C./45 MPa] | 54275O-B | 599.3 | 39.2 | 45.7 |
| 1950° F./18.0 ksi | 54275T-B | 410.1 | 27.9 | 48.8 |
| [1066° C./124 MPa] | 54275U-B | 420.6 | 39.1 | 41.1 |
| 2050° F./15.0 ksi | 54275X-B | 287.5 | 26.3 | 32.7 |
| [1121° C./103 MPa] | 54275Y-B | 205.8 | 22.7 | 25.1 |

TABLE 4-continued

CMSX ®-8 Heat 5V0460
Heat 5V0460 - Mold 54275 - HP2 Solid Turbine Blades
RR SCFO [Indy] - LA11865 (Joliet 9220/CM-373)
Fully Heat Treated - Solution + double age - 2050° F. Primary age MFB Mini Flats [0.020" Thick Gage] (LTE)

| Test Condition | ID | Rupture Life, hrs | % Elong |
|---|---|---|---|
| 1800° F./30.0 ksi | 54275A-F | 490.7 | 41.1 |
| [982° C./207 MPa] | 54275B-F | 446.0 | 28.8 |
| | 54275E-F | 437.5 | 24.2 |
| | 54275H-F | 381.9 | 31.6 |
| 1904° F./21.0 ksi | 54275I-F | 404.0 | 36.4 |
| [1040° C./145 MPa] | 54275J-F | 325.1 | 28.6 |
| | 54275K-F | 312.1 | 24.5 |
| | 54275L-F | 341.1 | 26.6 |

Figure 21:
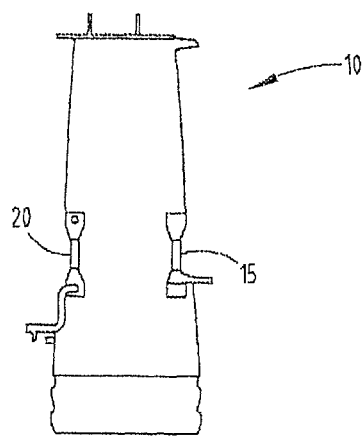
FIG. 21 is a drawing in cross section of a single crystal solid turbine blade cast from an alloy as disclosed herein which has the facility to machine both mini-bar and mini-flat specimens for machined-from-blade (MFB) stress-rupture testing.

Mini-flat bar stress-rupture testing was performed on single crystal solid turbine blades 10 (FIG. 21) cast from alloys as disclosed herein that have facility to machine mini-bar specimens 15 and mini-flat specimens 20.

Figure 18:
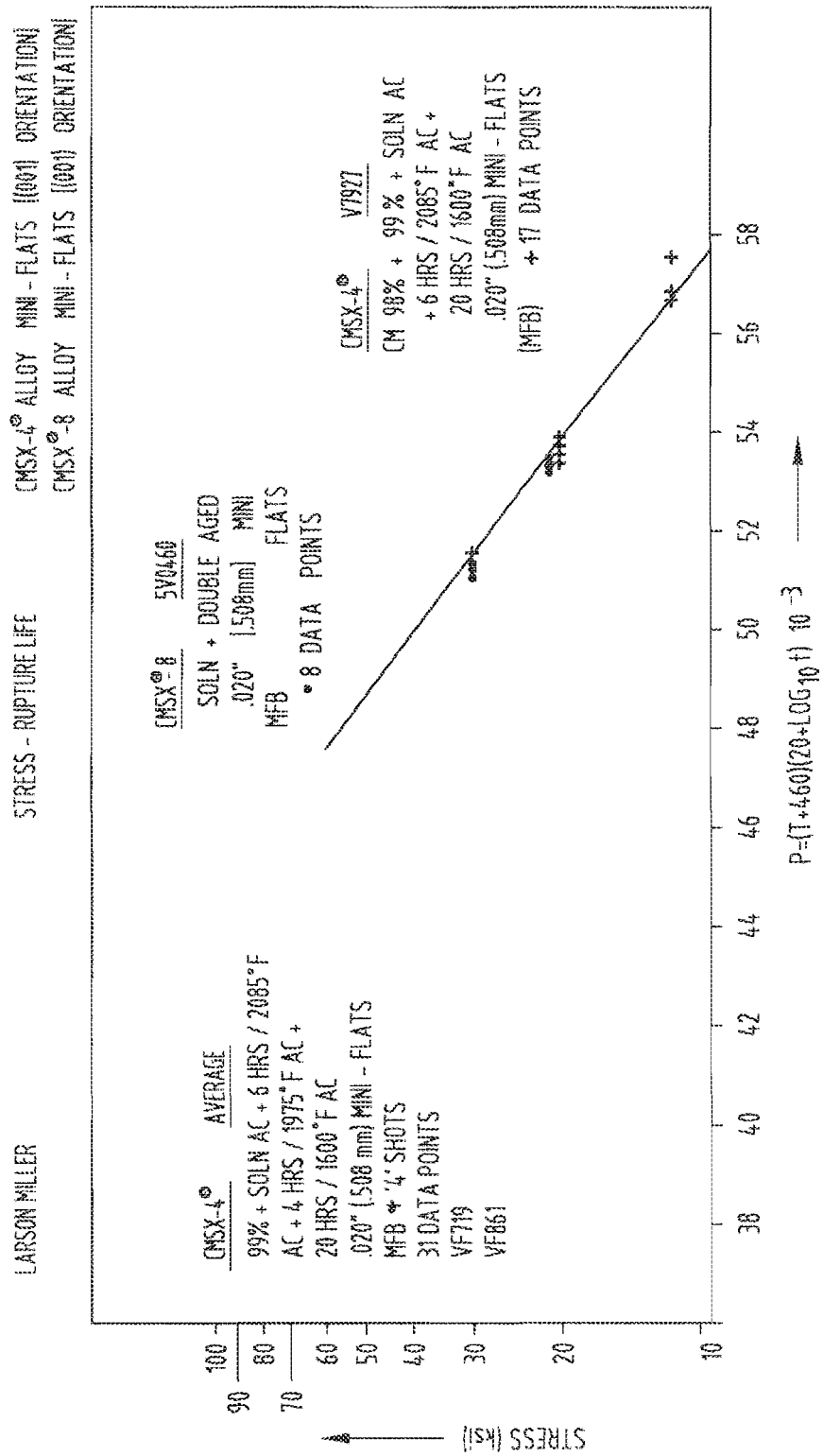
FIG. 18 is a Larson-Miller stress-rupture graphs showing the surprisingly good stress-rupture life properties of single crystal test bars and turbine blade castings made from the disclosed alloys.

A Larson-Miller stress-rupture graph (FIG. 18) shows CMSX®-8 alloy has surprisingly good stress-rupture life properties, from machined-from-blade (MFB) mini-flat (0.020" (0.508 mm) gage thickness) specimens, that are close to those of a CMSX-4® alloy.

The embodiments disclosed herein are non-limiting examples that are provided to illustrate and facilitate a better understanding, the scope of the invention being defined by the appending claims as properly construed under the patent laws, including the doctrine of equivalents.

The above description is intended to be illustrative, not restrictive. The scope of the invention should be determined with reference to the appended claims along with the full scope of equivalents. It is anticipated and intended that future developments will occur in the art, and that the disclosed devices, kits and methods will be incorporated into such future embodiments. Thus, the invention is capable of modification and variation and is limited only by the following claims.

What is claimed is:

1. A nickel-base superalloy for single crystal casting, comprising:
   5.60% to 5.80% aluminum by weight;
   9.4% to 9.9% cobalt by weight;
   4.9% to 5.5% chromium by weight;
   0.08% to 0.35% hafnium by weight;
   0.50% to 0.70% molybdenum by weight;
   1.4% to 1.6% rhenium by weight;
   8.1% to 8.5% tantalum by weight;
   0.60% to 0.80% titanium by weight;
   7.6 to 8.0% tungsten by weight;
   the balance consisting of nickel and incidental elements, the total amount of incidental elements being 1% or less; and
   wherein the casting exhibits a rupture life of at least about 200.2 hours at a temperature of 1800° F. under a load of 36.0 ksi.

2. The casting of claim 1 comprising:
   about 5.72% aluminum by weight;
   about 9.7% cobalt by weight;
   about 5.4% chromium by weight;
   about 0.30% hafnium by weight;
   about 0.59% molybdenum by weight;
   about 1.5% rhenium by weight;
   about 8.3% tantalum by weight;
   about 0.71% titanium by weight; and
   about 7.8% tungsten by weight.

3. The casting of claim 1, exhibiting a rupture life of at least about 983.5 hours at a temperature of 1600° F. under a load of 65 ksi, and a rupture life of at least 199.6 hours at a temperature of 1900° F. under a load of 25 ksi.

4. The casting of claim 1, wherein the time to 1% creep at a temperature of 1800° F. under a load of 36 ksi is at least 109.7 hours.

5. The casting of claim 4, wherein the time to 1% creep at a temperature of 1600° F. under a load of 65 ksi is at least 407.8 hours, and the time to 1% creep at a temperature of 1900° F. at a load of 25 ksi is at least 65.3 hours.

6. The casting of claim 1 that is homogenized and heat treated.

7. The casting of claim 6, wherein the homogenization is for a period of from 16 hours to 24 hours at temperatures from 2340° F. to 2408° F.

8. The casting of claim 6, wherein the heat treatment is for a period of 24 hours at temperatures from 2050° F. to 1600° F.

9. The casting of claim 8, wherein the homogenization is for a period of from 16 hours to 24 hours at temperatures from 2340° F. to 2408° F. and wherein the heat treatment is for a period of 24 hours at temperatures from 2050° F. to 1600° F.

10. The casting of claim 6, wherein the time to 1% creep at a temperature of 1800° F. under a load of 36 ksi is at least 109.7 hours, the time to 1% creep at a temperature of 1900° F. at a load of 25 ksi is at least 65.3 hours.

11. A nickel-base superalloy single crystal casting comprising:
   about 5.72% aluminum by weight;
   about 9.7% cobalt by weight;
   about 5.4% chromium by weight;
   about 0.30% hafnium by weight;
   about 0.59% molybdenum by weight;
   about 1.5% rhenium by weight;
   about 8.3% tantalum by weight;
   about 0.71% titanium by weight; and
   about 7.8% tungsten by weight;
   the balance consisting of nickel and incidental elements in an amount of 1% or less;
   wherein the casting exhibits a rupture life of at least about 200.2 hours at a temperature of 1800° F. under a load of 36.0 ksi, a rupture life of at least about 983.5 hours at a temperature of 1600° F. under a load of 65 ksi, and a rupture life of at least 199.6 hours at a temperature of 1900° F. under a load of 25 ksi.

12. The casting of claim 11 that is homogenized and heat treated.

13. The casting of claim 12, wherein the homogenization is for a period of from 16 hours to 24 hours at temperatures from 2340° F. to 2408° F.

14. The casting of claim 12, wherein the heat treatment is for a period of 24 hours at temperatures from 2050° F. to 1600° F.

15. The casting of claim 12, wherein the homogenization is for a period of from 16 hours to 24 hours at temperatures from 2340° F. to 2408° F. and wherein the heat treatment is for a period of 24 hours at temperatures from 2050° F. to 1600° F.

* * * * *